(12) United States Patent
Bao et al.

(10) Patent No.: US 6,867,135 B1
(45) Date of Patent: Mar. 15, 2005

(54) VIA BOTTOM COPPER/BARRIER INTERFACE IMPROVEMENT TO RESOLVE VIA ELECTROMIGRATION AND STRESS MIGRATION

(75) Inventors: Tien I Bao, Hsin-Chu (TW);
Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/126,417

(22) Filed: Apr. 19, 2002

(51) Int. Cl.$^7$ ............................................. H01L 21/44
(52) U.S. Cl. ...................... 438/687; 438/630; 438/649; 438/651; 438/655; 438/682
(58) Field of Search ................... 438/626, 630, 438/633, 635, 637, 644, 649, 651, 655, 658, 672, 678, 682, 687, 612, 617, 618, 461–464; 259/780, 781

(56) References Cited

U.S. PATENT DOCUMENTS

| | | | |
|---|---|---|---|
| 4,507,851 A | * 4/1985 | Joyner et al. ............... 438/643 |
| 4,800,177 A | * 1/1989 | Nakamae .................... 438/627 |
| 5,447,887 A |   9/1995 | Filipiak et al. ............. 437/200 |
| 5,998,873 A | * 12/1999 | Blair et al. ................. 257/766 |
| 6,046,108 A |   4/2000 | Liu et al. .................... 438/687 |
| 6,211,084 B1 |   4/2001 | Ngo et al. .................. 438/687 |
| 6,214,731 B1 |   4/2001 | Nogami et al. ............. 438/687 |
| 6,251,775 B1 | * 6/2001 | Armbrust et al. ........... 438/644 |

* cited by examiner

*Primary Examiner*—Amir Zarabian
*Assistant Examiner*—Khanh B. Duong
(74) *Attorney, Agent, or Firm*—Haynes and Boone, LLP

(57) ABSTRACT

A method of forming a copper/barrier layer interface comprising the following sequential steps. A structure having a lower copper layer formed thereover is provide. A patterned dielectric layer is formed over the lower copper layer. The patterned dielectric layer having an opening exposing a portion of the lower copper layer. The exposed portion of the lower copper layer is converted to a copper silicide portion. A barrier layer is formed upon the patterned dielectric layer and the copper silicide portion, lining the opening, whereby the lower copper layer/barrier layer interface is formed such that the barrier layer contacts the copper silicide portion to form an interface.

51 Claims, 1 Drawing Sheet

VIA BOTTOM COPPER/BARRIER INTERFACE IMPROVEMENT TO RESOLVE VIA ELECTROMIGRATION AND STRESS MIGRATION

FIELD OF THE INVENTION

The present invention relates generally to semiconductor fabrication and more specifically to formation of copper structures having a lower copper layer/barrier layer interface.

BACKGROUND OF THE INVENTION

When forming conventional copper structures in a via opening exposing an underlying relatively wide copper line, i.e. greater than about 2 μm, a bulge or hump of the underlying copper forms in the via due to the thermal process. The thermal process causes the copper to "grow" due to the thermal expansion of the underlying copper line at temperatures of from about 120 to 250° C.

A barrier layer is then formed within the via opening, lining the via opening and a second layer of copper is deposited over the barrier layer, filling the via opening. The second copper layer is then planarized to form a planarized copper structure. Later, during burn-in or reliability testing, the underlying copper layer hump shrinks due to stress migration (SM) leaving a void at the via bottom adjacent the barrier layer which deleteriously affects performance of the device(s).

U.S. Pat. No. 6,214,731 B1 to Nogami et al. describes a method of forming copper interconnection patterns whereby a barrier layer liner is formed within a via opening; a thin silicon layer is formed over the barrier layer liner; copper is deposited to fill the opening and is reacted with the thin silicon layer to form a thin layer of copper silicide at the interface between the copper layer and the barrier layer liner.

U.S. Pat. No. 6,211,084 B1 to Ngo et al. describes a copper silicide cap layer.

U.S. Pat. No. 6,046,108 to Liu et al. describes a selective copper silicide process and a copper interconnect process.

U.S. Pat. No. 5,447,887 to Filipiak et al. describes a copper silicide process.

SUMMARY OF THE INVENTION

Accordingly, it is an object of one or more embodiments of the present invention to provide an improved method of forming a copper layer/barrier layer interface.

Other objects will appear hereinafter.

It has now been discovered that the above and other objects of the present invention may be accomplished in the following manner. Specifically, a structure having a lower copper layer formed thereover is provided. A patterned dielectric layer is formed over the lower copper layer. The patterned dielectric layer having an opening exposing a portion of the lower copper layer. The exposed portion of the lower copper layer is converted to a copper silicide portion. A barrier layer is formed upon the patterned dielectric layer and the copper silicide portion, lining the opening, whereby the lower copper layer/barrier layer interface is formed such that the barrier layer contacts the copper silicide portion to form an interface.

DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Initial Structure

Figure 1:
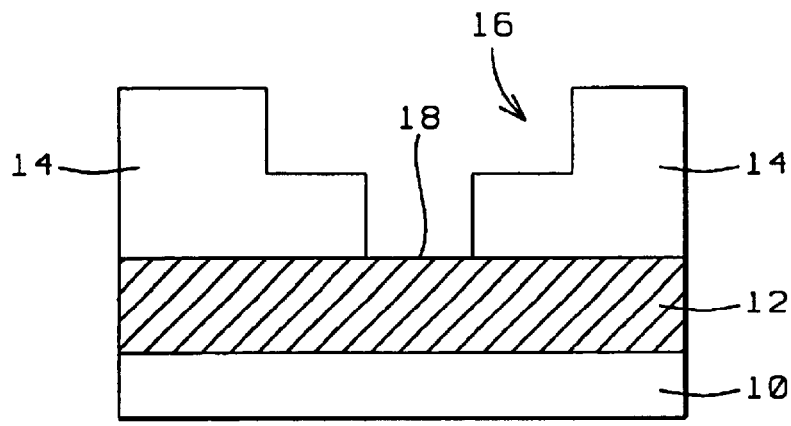
FIGS. 1 to 3 schematically illustrate a preferred embodiment of the present invention.
Figure 2:
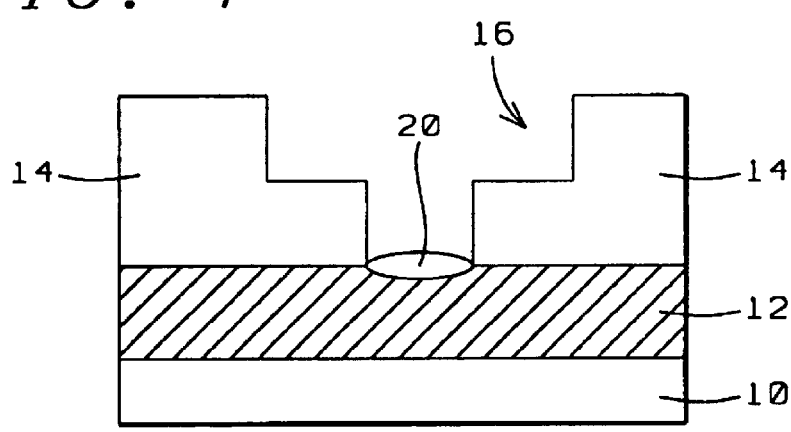

As shown in FIG. 1, structure 10 has a metal layer 12 formed thereover. Metal layer 12 is preferably comprised of copper, aluminum, silver or gold and is more preferably comprised of copper as will be used for illustrative purposes hereafter. Copper layer 12 is preferably from about 1000 to 8000 Å thick and is more preferably from about 1000 to 5000 Å thick. Copper layer 12 may be, for example, a copper line having a width of greater than about 0.5 to 3.0 μm and more preferably greater than about 2.0 μm.

Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

A dielectric layer 14 is formed over copper line 12 to a thickness of preferably from about 1000 to 10,000 Å and more preferably from about 3000 to 8000 Å. Dielectric layer 14 is preferably comprised of SiOCH or FSG. Dielectric layer 14 may be an intermetal dielectric (IMD) layer.

Dielectric layer 14 is patterned to form opening 16 therein, exposing a portion 18 of copper line 12. Opening 16 may be a damascene opening or a dual damascene opening.

Formation of Metal Silicide Portion 20

In one key step of the invention, metal/copper line portion 18 is converted to a metal/copper silicide portion 20 by: either (1) a silicon-containing gas or precursor soak process; or (2) a plasma-assisted copper silicide formation process. Metal/copper silicide portion 20 has a thickness of preferably from about 5 to 1000 Å and more preferably from about 10 to 500 Å.

(1) In the silicon-containing gas or precursor soak process, the copper line portion 18 is subjected to a silicon (Si)-containing gas soak or a precursor soak preferably such as $SiH_4$, $Si_2H_6$, 1-methylsilane (1MS), 2-methylsilane (2MS), 3-methylsilane (3MS) or 4-methylsilane (4MS) and is more preferably $SiH_4$ or $Si_2H_6$. The soak is conducted at a temperature preferably from about 10 to 800° C. and more preferably from about 100 to 400° C. for preferably from about 0.1 to 100 seconds and more preferably, for from about 1 to 10 seconds. Soaking involves heating in a gas environment.

(2) The plasma assisted copper silicide formation process is conducted preferably using a silicon-containing plasma, a $SiH_4$ plasma, a $Si_2H_6$ plasma, a 1MS plasma, a 2MS plasma, a 3MS plasma or a 4MS plasma and more preferably a $SiH_4$ plasma under the following conditions:

power: preferably from about 10 to 1000 watts and more preferably from about 50 to 500 watts;

bias power: preferably from about 0 to 1000 watts and more preferably from about 0 to 100 watts;

temperature: preferably from about 10 to 800° C. and more preferably from about 100 to 400° C.;

SiH$_4$ flow rate: preferably from about 1 to 500 sccm and more preferably from about 10 to 100 sccm;

time: preferably from about 0.1 to 100 seconds and more preferably from about 1 to 10 seconds; and pressure preferably from about 1 mTorr to 100 Torr and more preferably from about 10 mTorr to 10 Torr.

Formation of Barrier Layer 22 and Planarized Copper Structure 24

Figure 3:
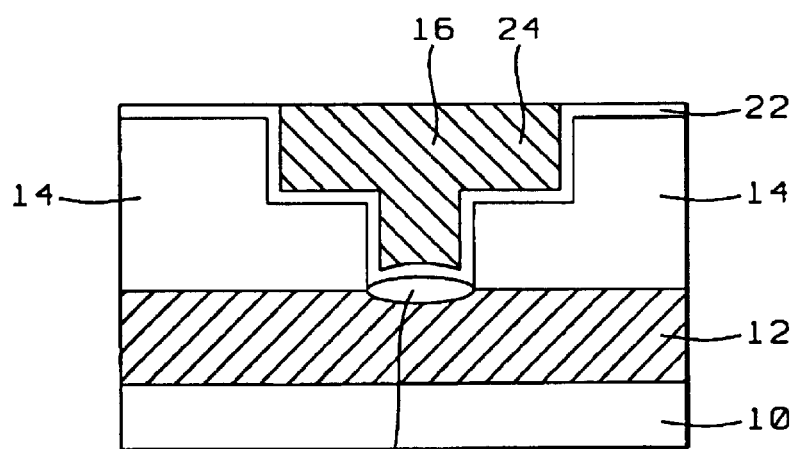

As shown in FIG. 3, a barrier layer 22 is then formed over the patterned dielectric layer 14 and the copper silicide portion 20, and lining the opening 16. The barrier layer 22 has a thickness of preferably from about 5 to 500 Å and more preferably from about 10 to 100 Å. The barrier layer 22 is preferably formed of TaN, Ta, Ti, TiN, TiSiN or WN and is more preferably comprised of TaN, Ta, Ti or TiN.

An upper metal layer is deposited over the barrier layer 22 and is then planarized, preferably by chemical mechanical polishing (CMP), to form a planarized metal structure 24 within the barrier layer 22 lined opening 16. The upper metal layer is preferably comprised of copper, aluminum, silver or gold and is more preferably comprised of copper.

The advantages of one or more embodiments of the present invention include resolution of the copper stress migration issue.

While particular embodiments of the present invention have been illustrated and described, it is not intended to limit the invention, except as defined by the following claims.

We claim:

1. A method of forming a metal layer/barrier layer interface, comprising the sequential steps of:

providing a structure having a lower metal layer formed thereover;

forming a patterned dielectric layer over the lower metal layer; the patterned dielectric layer having an opening exposing a portion of the lower metal layer;

converting the exposed portion of the lower metal layer to a metal silicide portion; and forming a barrier layer upon the patterned dielectric layer and the metal silicide portion, lining the opening; whereby a lower metal layer/barrier layer interface is formed such that the barrier layer contacts the metal silicide portion to form an interface.

2. The method of claim 1, wherein the structure is a semiconductor substrate.

3. The method of claim 1, wherein the lower metal layer is a copper line having a width of greater than about 0.5 to 3.0 μm.

4. The method of claim 1, wherein the lower metal layer is a copper line having a width of greater than about 2.0 μm.

5. The method of claim 1, wherein the lower metal layer has a thickness of from about 1000 to 8000 Å and the patterned dielectric layer has a thickness of from about 1000 to 10,000 Å.

6. The method of claim 1, wherein the lower metal layer has a thickness of from about 1000 to 5000 Å and the patterned dielectric layer has a thickness of from about 3000 to 8000 Å.

7. The method of claim 1, wherein the patterned dielectric layer is an intermetal dielectric layer.

8. The method of claim 1, wherein the metal silicide portion has a thickness of from about 5 to 1000 Å and the barrier layer has a thickness of from about 5 to 500 Å.

9. The method of claim 1, wherein the metal silicide portion has a thickness of from about 10 to 500 Å and the barrier layer has a thickness of from about 10 to 100 Å.

10. The method of claim 1, including the step of forming a planarized metal structure within the barrier layer lined opening.

11. The method of claim 1, including the steps of:

forming an upper metal layer over the barrier layer; and planarizing the upper metal layer to form a planarized metal structure within the opening.

12. The method of claim 1, wherein the metal silicide portion is formed employing either:

1) a silicon-containing gas or precursor soak process; or 2) a plasma-assisted metal silicide formation process.

13. The method of claim 1, wherein the metal silicide portion is formed employing a silicon-containing gas or precursor soak process at a temperature of from about 10 to 800° C.

14. The method of claim 1, wherein the metal silicide portion is formed employing a silicon-containing gas or precursor soak process at a temperature of from about 100 to 400° C.

15. The method of claim 1, wherein the metal silicide portion 20 is formed employing a silicon-containing gas or precursor soak process; the precursor being a gas selected from the group consisting of SiH$_4$, Si$_2$H$_6$, 1-methylsilane, 2-methylsilane, 3-methylsilane, and 4-methylsilane.

16. The method of claim 1, wherein the metal silicide portion is formed employing a silicon-containing gas or precursor soak process; the precursor being a gas selected from the group consisting of SiH$_4$ and Si$_2$H$_6$.

17. The method of claim 1, wherein the metal silicide portion is formed employing a plasma-assisted metal silicide formation process using a SiH$_4$ plasma under the conditions including:

power: from about 10 to 1000 watts;

bias power: from about 0 to 100 watts;

temperature: from about 10 to 800° C.;

SiH$_4$ flow rate: from about 1 to 500 sccm;

time: from about 0.1 to 100 seconds; and pressure: from about 1 mTorr to 100 Torr.

18. The method of claim 1, wherein the metal silicide portion is formed employing a plasma-assisted metal silicide formation process using a SiH$_4$ plasma under the conditions including:

power: from about 50 to 500 watts;

bias power: from about 0 to 100 watts;

temperature: from about 100 to 400° C.;

SiH$_4$ flow rate: from about 10 to 100 sccm;

time: from about 1 to 10 seconds; and pressure from about 10 mTorr to 10 Torr.

19. The method of claim 1, wherein the lower metal layer is comprised of a metal selected from the group consisting of copper, aluminum, silver and gold.

20. The method of claim 1, including the steps of:

forming an upper metal layer over the barrier layer; and planarizing the upper metal layer to form a planarized metal structure within the opening;

the upper metal layer being comprised of a metal selected from the group consisting of copper, aluminum, silver and gold.

21. A method of forming a copper layer/barrier layer interface, comprising the sequential steps of:

providing a structure having a lower copper layer formed thereover;

forming a patterned dielectric layer over the lower copper layer; the patterned dielectric layer having an opening exposing a portion of the lower copper layer;

converting the exposed portion of the lower copper layer to a copper silicide portion;

forming a barrier layer upon the patterned dielectric layer and the copper silicide portion, lining the opening; whereby a lower copper layer/barrier layer interface is formed such that the barrier layer directly contacts the copper silicide portion to form a void-free interface; and forming a planarized copper structure within the barrier layer lined opening.

22. The method of claim 21, wherein the structure is a semiconductor substrate.

23. The method of claim 21, wherein the lower copper layer is a copper line having a width of greater than about 0.5 to 3.0 µm.

24. The method of claim 21, wherein the lower copper layer is a copper line having a width of greater than about 2.0 µm.

25. The method of claim 21, wherein the lower copper layer has a thickness of from about 1000 to 8000 Å and the patterned dielectric layer has a thickness of from about 1000 to 10,000 Å.

26. The method of claim 21, wherein the lower copper layer has a thickness of from about 1000 to 5000 Å and the patterned dielectric layer has a thickness of from about 3000 to 8000 Å.

27. The method of claim 21, wherein the patterned dielectric layer is an intermetal dielectric layer.

28. The method of claim 21, wherein the copper silicide portion has a thickness of from about 5 to 1000 Å and the barrier layer has a thickness of from about 5 to 500 Å.

29. The method of claim 21, wherein the copper silicide portion has a thickness of from about 10 to 500 Å and the barrier layer has a thickness of from about 10 to 100 Å.

30. The method of claim 21, wherein the copper silicide portion is formed employing either:
1) a silicon-containing gas or precursor soak process; or
2) a plasma-assisted copper silicide formation process.

31. The method of claim 21, wherein the copper silicide portion is formed employing a silicon-containing gas or precursor soak process at a temperature of from about 10 to 800° C.

32. The method of claim 21, wherein the copper silicide portion is formed employing a silicon-containing gas or precursor soak process at a temperature of from about 100 to 400° C.

33. The method of claim 21, wherein the copper silicide portion is formed employing a silicon-containing gas or precursor soak process; the precursor being a gas selected from the group consisting of $SiH_4$, $Si_2H_6$, 1-methylsilane, 2-methylsilane, 3-methylsilane and 4-methylsilane.

34. The method of claim 21, wherein the copper silicide portion is formed employing a silicon-containing gas or precursor soak process; the precursor being a gas selected from the group consisting of $SiH_4$ and $Si_2H_6$.

35. The method of claim 21, wherein the copper silicide portion is formed employing a plasma-assisted copper silicide formation process using a $SiH_4$ plasma under the conditions including:
power: from about 10 to 1000 watts;
bias power: from about 0 to 100 watts;
temperature: from about 10 to 800° C.;
$SiH_4$ flow rate: from about 1 to 500 sccm;
time: from about 0.1 to 100 seconds; and
pressure: from about 1 mTorr to 100 Torr.

36. The method of claim 21, wherein the copper silicide portion is formed employing a plasma-assisted copper silicide formation process using a $SiH_4$ plasma under the conditions including:
power: from about 50 to 500 watts;
bias power: from about 0 to 100 watts;
temperature: from about 100 to 400° C.;
$SiH_4$ flow rate: from about 10 to 100 sccm;
time: from about 1 to 10 seconds; and
pressure from about 10 mTorr to 10 Torr.

37. A method of forming a copper layer/barrier layer interface, comprising the sequential steps of:

providing a structure having a lower copper layer formed thereover;

forming a patterned dielectric layer over the lower copper layer; the patterned dielectric layer having an opening exposing a portion of the lower copper layer;

converting the exposed portion of the lower copper layer to a copper silicide portion by employing either:
1) a silicon-containing gas or precursor soak process; or
2) a plasma-assisted copper silicide formation process;

forming a barrier layer upon the patterned dielectric layer and the copper silicide portion, lining the opening; whereby a lower copper layer/barrier layer interface is formed such that the barrier layer directly contacts the copper silicide portion to form a void-free interface; and forming a planarized copper structure within the barrier layer lined opening.

38. The method of claim 37, wherein the structure is a semiconductor substrate.

39. The method of claim 37, wherein the lower copper layer is a copper line having a width of greater than about 0.5 to 3.0 µm.

40. The method of claim 37, wherein the lower copper layer is a copper line having a width of greater than about 2.0 µm.

41. The method of claim 37, wherein the lower copper layer has a thickness of from about 1000 to 8000 Å and the patterned dielectric layer has a thickness of from about 1000 to 10,000 Å.

42. The method of claim 37, wherein the lower copper layer has a thickness of from about 1000 to 5000 Å and the patterned dielectric layer has a thickness of from about 3000 to 8000 Å.

43. The method of claim 37, wherein the patterned dielectric layer is an intermetal dielectric layer.

44. The method of claim 37, wherein the copper silicide portion has a thickness of from about 5 to 1000 Å and the barrier layer has a thickness of from about 5 to 500 Å.

45. The method of claim 37, wherein the copper silicide portion has a thickness of from about 10 to 500 Å and the barrier layer has a thickness of from about 10 to 100 Å.

46. The method of claim 37, wherein the copper silicide portion is formed employing a silicon-containing gas or precursor soak process at a temperature of from about 10 to 800° C.

47. The method of claim 37, wherein the copper silicide portion is formed employing a silicon-containing gas or precursor soak process at a temperature of from about 100 to 400° C.

48. The method of claim 37, wherein the precursor being a gas selected from the group consisting of $SiH_4$, $Si_2H_6$, 1-methylsilane, 2-methylsilane, 3-methylsilane, and 4-methylsilane.

49. The method of claim 37, wherein the precursor being a gas selected from the group consisting of $SiH_4$ and $Si_2H_6$.

50. The method of claim 37, wherein the plasma-assisted copper silicide formation process uses a plasma selected from the group consisting of a $SiH_4$ plasma under the conditions including:

power: from about 10 to 1000 watts;
    bias power: from about 0 to 100 watts;
    temperature: from about 10 to 800° C.;
    $SiH_4$ flow rate: from about 1 to 500 sccm;
    time: from about 0.1 to 100 seconds; and
    pressure: from about 1 mTorr to 100 Torr.

51. The method of claim 37, wherein the plasma-assisted copper silicide formation process uses a plasma selected from the group consisting of a $SiH_4$ plasma under the conditions including:

power: from about 50 to 500 watts;
    bias power: from about 0 to 100 watts;
    temperature: from about 100 to 400° C.;
    $SiH_4$ flow rate: from about 10 to 100 sccm;
    time: from about 1 to 10 seconds; and
    pressure from about 10 mTorr to 10 Torr.

\* \* \* \* \*